United States Patent
Cheng et al.

[11] Patent Number: 5,923,988
[45] Date of Patent: Jul. 13, 1999

[54] TWO STEP THERMAL TREATMENT PROCEDURE APPLIED TO POLYCIDE STRUCTURES DEPOSITED USING DICHLOROSILANE AS A REACTANT

[75] Inventors: Kuo-Hsien Cheng, Hsin-Chu; Chi-Di An, Pan-Chiao; Wen Jan Lin, Chiung Lin Town; Hung-Che Liao, Tainan; Jer-Yuan Sheu, Hsin-Chu, all of Taiwan

[73] Assignee: Taiwan Semiconductor Manufacturing Company, Ltd., Hsin-Chu, Taiwan

[21] Appl. No.: 09/079,526

[22] Filed: May 15, 1998

Related U.S. Application Data

[51] Int. Cl.$^6$ .................................................. H01L 21/336
[52] U.S. Cl. ........................... 438/305; 438/210; 438/230; 438/398; 438/643
[58] Field of Search .................. 438/210, 230, 438/231, 305, 643, 653, 654, 664, 398

[56] References Cited

U.S. PATENT DOCUMENTS

| | | | |
|---|---|---|---|
| 4,833,099 | 5/1989 | Woo | 438/230 |
| 5,075,251 | 12/1991 | Torres et al. | 438/664 |
| 5,182,232 | 1/1993 | Chhabra et al. | 438/398 |
| 5,231,056 | 7/1993 | Sandhu | 438/654 |
| 5,393,685 | 2/1995 | Yoo et al. | 438/231 |
| 5,541,131 | 7/1996 | Yoo et al. | 438/305 |
| 5,550,078 | 8/1996 | Sung | 438/210 |
| 5,552,339 | 9/1996 | Hsieh | 438/643 |
| 5,624,870 | 4/1997 | Chien et al. | 438/653 |
| 5,633,200 | 5/1997 | Hu | 438/653 |
| 5,691,235 | 11/1997 | Meikle et al. | 438/653 |
| 5,706,164 | 1/1998 | Jeng | 438/142 |
| 5,763,303 | 6/1998 | Liaw et al. | 438/210 |

*Primary Examiner*—Peter Toby Brown
*Assistant Examiner*—Khanh Duong
*Attorney, Agent, or Firm*—George O. Saile; Stephen B. Ackerman

[57] ABSTRACT

A process for fabricating a polycide SAC structure, for a MOSFET device, has been developed. This process features a polycide SAC structure, comprised of tungsten silicide on in situ doped polysilicon, using tungsten hexafluoride and dichlorosilane as reactants for deposition of tungsten silicide. A first thermal anneal treatment is performed prior to polycide patterning, supplying protection to exposed tungsten silicide sides, during the patterning procedure. A second thermal anneal treatment is performed after polycide patterning, and prior to a silicon oxide deposition, offering protection to the exposed top surface of tungsten silicide, during the silicon oxide deposition.

21 Claims, 3 Drawing Sheets

TWO STEP THERMAL TREATMENT PROCEDURE APPLIED TO POLYCIDE STRUCTURES DEPOSITED USING DICHLOROSILANE AS A REACTANT

BACKGROUND OF THE INVENTION (1) Field of the Invention

The present invention relates to processes used to fabricate semiconductor devices, and more specifically to a process used to create a self-aligned contact structure, where one of the components of the self-aligned contact structure is a metal silicide layer.

(2) Description of Prior Art

Major objectives of the semiconductor industry have been to increase chip performance while still maintaining, or even decreasing the processing cost for these same chips. The ability to create semiconductor devices, with sub-micron features, or micro-miniaturization, has allowed these objectives to be partially realized. Smaller device features result in a reduction in performance degrading capacitances and resistances, thus allowing performance increases to be achieved. In addition, smaller, or sub-micron features, allow smaller chips to be fabricated, however still possessing device densities achieved with larger chips, thus resulting in a greater number of chips to be realized from a specific size substrate, and thus reducing the processing cost for a specific chip.

Micro-miniaturization has been accomplished via enhancements in specific semiconductor fabrication disciplines, such as photolithography and dry etching. The use of more sophisticated exposure cameras, and the use of more sensitive photoresist materials, have allowed sub-micron features to be routinely achieved in photoresist layers. In addition the use of advanced dry etching tools, and processes, have resulted in the successful transfer of the sub-micron images in photoresist layers, to underlying materials, used for the creation of semiconductor devices. However in addition to contributions offered by the advances in semiconductor fabrication disciplines, structural enhancement, such as the use of self-aligned contacts, (SAC), have also been a major contributor to the quest for smaller, higher performing semiconductor chips. The SAC concept entails an opening to a source/drain region, located between word line, or gate structures, of metal oxide semiconductor field effect transistors, (MOSFET), with the SAC opening larger, in width, than the space between word line structures. The opening therefore includes not only the entire width of the source/drain region, but also includes exposure of a portion of the top surface of insulator capped, polycide gate structures. Prior to the use of the SAC technology, designs had to provide more area for source/drain regions, to insure that contact holes would fully land on these regions. That limitation resulting in larger devices, thus higher processing costs.

Metal structures, to source/drain regions, exposed in the SAC opening, described as SAC structures, are usually formed using polysilicon, or metal silicide—polysilicon, (polycide), layers. These structures contact the source/drain region, between polycide gate structures, and overlap the top surface of the insulator capped, polycide gate structures. Prior art, such as Jeng, in U.S. Pat No. 5,706,164, have described SAC structures, comprised of metal silicide on polysilicon, where the metal silicide is a tungsten silicide layer, obtained via a chemical vapor deposition procedure using tungsten hexafluoride and silane as reactants, with the polycide SAC structure, interfacing a polysilicon landing plug, with the polysilicon landing pad contacting the source/drain region. This invention will describe a polycide SAC structure that directly contact the source/drain region, without the use of a polysilicon landing plug, thus demanding excellent step coverage characteristics, needed to traverse the severe topology of the SAC opening. Therefore to improve the step coverage of the polycide SAC structure, dichlorosilane is used in place of silane, along with tungsten hexafluoride, to provide the reactants needed for polycide deposition. The use of dichlorosilane as a reactant, increases the step coverage of the polycide structure in the SAC opening, however necessitates the use of a two step thermal anneal procedure, applied at specific stages of polycide formation, to improve the quality of the dichlorosilane deposited, polycide material.

SUMMARY OF THE INVENTION

It is an object of this invention to create a polycide, self aligned contact, (SAC), structure.

It is another object of this invention to use a tungsten silicide layer, as a component of the polycide SAC structure, using dichlorosilane and tungsten hexafluoride, as reactants for deposition of the tungsten silicide layer.

It is still another object of this invention to use two thermal anneal treatments during the formation of the polycide SAC structure, one after deposition of the tungsten silicide layer, and another after polycide patterning, to protect exposed regions of tungsten silicide during patterning procedures, and during subsequent overlying insulator depositions.

In accordance with the present invention a process is described for fabricating a polycide SAC structure, used in metal oxide semiconductor field effect transistor, (MOSFET), devices, in which a tungsten silicide layer, used as part of the polycide SAC structure, is deposited using dichlorosilane as a reactant, and with the tungsten silicide layer experiencing anneal cycles, performed at two specific stages of formation of the polycide SAC structure. After formation of gate structures, on thin gate oxides, and with the gate structure capped with an insulator layer, lightly doped source and drain regions are formed, in areas not covered by the insulator capped, gate structures. After formation of insulator spacers, on the sides of the gate structures, heavily doped source and drain regions are formed in the space between gate structures. An insulator layer is deposited and patterned to produce a self-aligned contact, (SAC), opening, exposing a heavily doped source and drain region in the space between insulator capped, gate structures. A deposition of an in situ doped, polysilicon layer, is next performed, followed by the deposition of a tungsten silicide layer, using tungsten hexafluoride and dichlorosilane, as reactants. A first thermal anneal is next performed to the unetched composite layer, followed by a patterning procedure, resulting in the polycide SAC structure, comprised of tungsten silicide, on in situ doped polysilicon. After removal of masking photoresist shapes, and careful wet cleans, a second thermal anneal procedure is performed to the polycide SAC structure. A interlevel insulator layer is next deposited, overlying the thermally treated polycide, SAC structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

A method for fabricating a polycide SAC structure for MOSFET devices, in which a tungsten silicide layer, used as a component of the polycide SAC structure, is deposited using dichlorosilane as a reactant, and featuring thermal anneal treatments, used at specific stages of fabrication of the polycide SAC structure, will now be described in detail. The polycide SAC structure, described in this invention, is shown applied to N-channel, MOSFET devices, however this invention can also be applied to P-channel, MOSFET devices.

Figure 1:
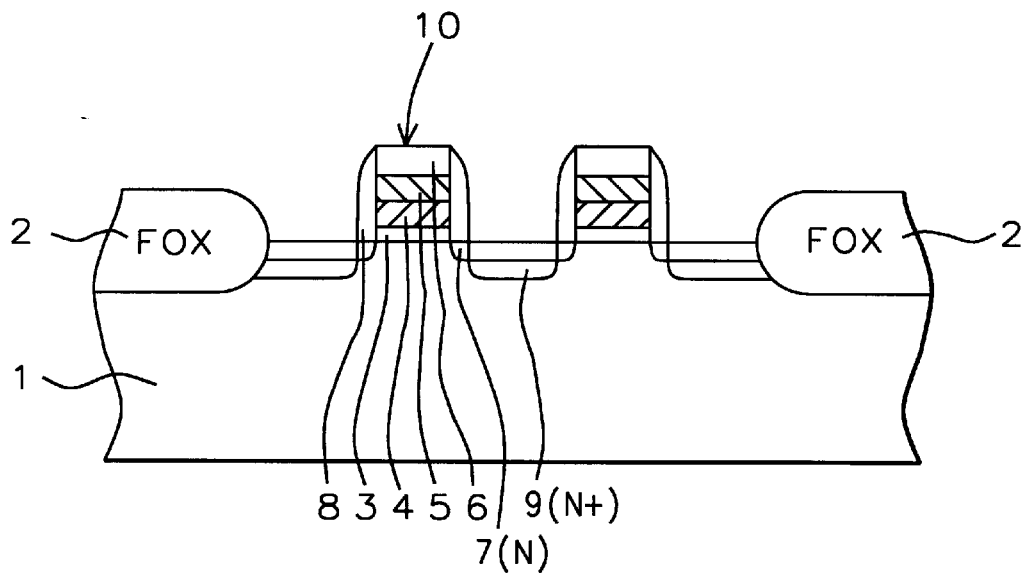
FIGS. 1–5, which schematically, in cross-sectional style, present key stages of fabrication of a polycide SAC structure, used for MOSFET devices, where the tungsten silicide layer, used as a component of the polycide SAC structure, is deposited using dicholorosilane as a reactant, and where thermal anneals are used at specific fabrication stages of the polycide SAC structure.

A P type, single crystalline, silicon substrate 1, with a <100> crystallographic orientation, is used, and shown schematically in FIG. 1. Field oxide, (FOX), regions 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride—silicon oxide composite masking layer. After removal of the composite, oxidation resistant mask, a thin gate, silicon dioxide layer 3, is thermally grown, in an oxygen steam ambient, at a temperature between about 850 to 1000° C., to a thickness between about 50 to 250 Angstroms. Next a first layer of in situ doped polysilicon 4, is deposited using low pressure chemical vapor deposition, (LPCVD), procedures, at a temperature between about 500 to 600° C., to a thickness between about 500 to 1500 Angstroms, using silane as a source, and with the addition of phosphine to provide the needed dopant. A first layer of tungsten silicide 5, is then deposited, using LPCVD procedures, at a temperature between about 380 to 600° C., to a thickness between about 800 to 1500 Angstroms, using tungsten hexafluoride and dichlorosilane as reactants. Finally a first silicon oxide layer 6, is deposited using either LPCVD or plasma enhanced chemical vapor deposition, (PECVD), procedures, at a temperature between about 300 to 750° C., to a thickness between about 1000 to 2500 Angstroms, using tetraethylorthosilicate, (TEOS), as a source.

Conventional photolithographic and reactive ion etching, (RIE), procedures, using $CHF_3$ as an etchant for first silicon oxide layer 6, and $Cl_2$ as an etchant for both first tungsten silicide layer 5, and for first polysilicon layer 4, are used to produce the silicon oxide capped, polycide gate, (first tungsten silicide—first polysilicon), structures 10, shown schematically in FIG. 1. After photoresist removal via plasma oxygen ashing and careful wet cleans, a lightly doped source and drain region 7, is next created via ion implantation of phosphorous or arsenic, at an energy between about 25 to 75 KeV, at a dose between about 5E11 to 5E13 atoms/cm$^2$. A second silicon oxide layer is deposited, again via use of either LPCVD or PECVD procedures, at a temperature between about 300 to 750° C., to a thickness between about 800 to 2500 Angstroms, using TEOS as a source, followed, by an anisotropic RIE procedure, using $CHF_3$ as an etchant, to create insulator spacers 8, on polycide gate structures 10, schematically shown in FIG. 1. Heavily doped source and drain regions 9, are then produced via ion implantation of either arsenic or phosphorous, at an energy between about 30 to 100 KeV, at a dose between about 1E14 to 1E16 atoms/cm$^2$. This region is also shown schematically in FIG. 1.

Figure 2:
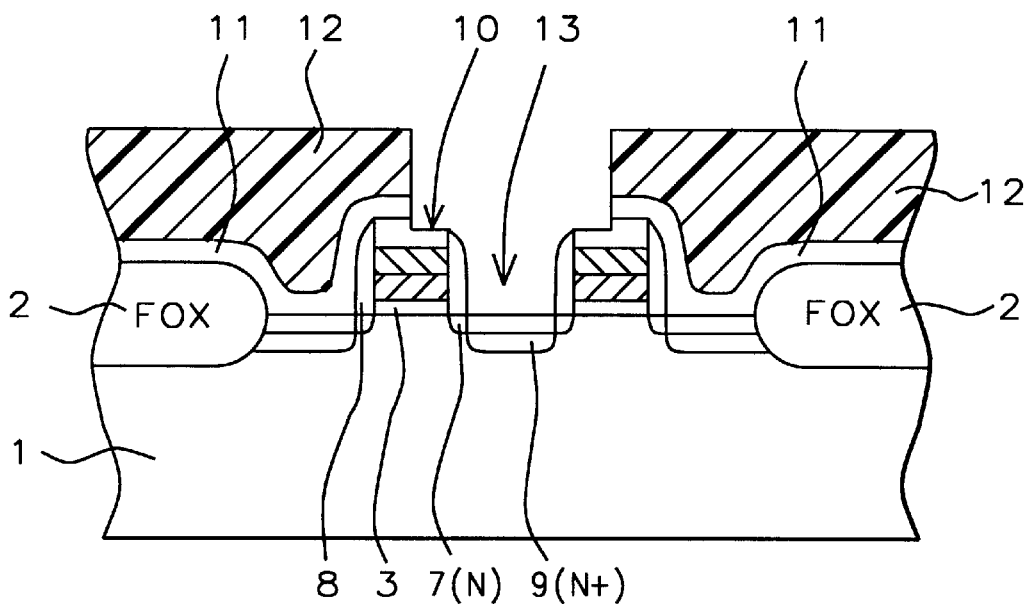

A third layer of silicon oxide 11, called the first interpolysilicon oxide, (IPO-1), layer, is deposited, again using either LPCVD or PECVD procedures, at a temperature between about 300 to 750° C., to a thickness between about 800 to 2500 Angstroms, using TEOS as a source. A first photoresist shape 12, is formed, and serves as a mask during an anisotropic reactive ion etching, (RIE), procedure, using $CHF_3$ as an etchant, resulting in the creation of self-aligned contact, (SAC), opening 13, shown schematically in FIG. 2. SAC opening 13, formed in IPO-1 layer 11, has a dimension larger in width than the space between polycide gate structures 10, thus exposing heavily doped source and drain region 9, between polycide gate structures, with SAC opening 13, also overlying portions of polycide gate structures 10. An over etch cycle, of the RIE procedure, used to insure complete removal of exposed IPO-1 layer 11, resulted in a removal of a portion of first silicon oxide layer 6, exposed during the SAC opening procedure. This is shown schematically in FIG. 2.

Figure 3:
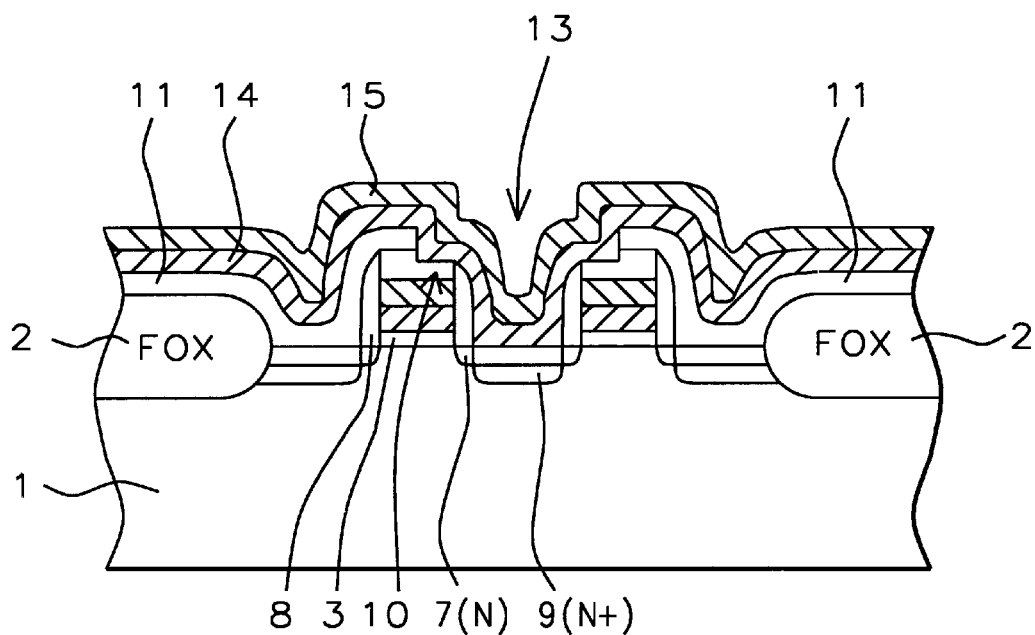

After removal of first photoresist shape 12, via plasma oxygen ashing and careful wet cleans, the materials needed for a polycide SAC structure are deposited. A second polysilicon layer 14, is deposited, via LPCVD procedures, to a thickness between about 200 to 1000 Angstroms. Second polysilicon layer 14, schematically shown in FIG. 3, is deposited using LPCVD procedures, using dichlorosilane as a source, incorporating in situ doping, via the addition of phosphine or arsine. A second tungsten silicide layer 15, is next deposited, using LPCVD procedures, at a temperature between about 380 to 600° C., to a thickness between about 800 to 1500 Angstroms. Second tungsten silicide layer 15, schematically shown in FIG. 3, is deposited using tungsten hexafluoride and dichlorosilane as reactants. The use of dichlorosilane as a reactant, in place of silane, provides improved step coverage of second tungsten silicide layer 15, in SAC opening 13. However an anisotropic RIE procedure, used to create a subsequent polycide SAC structure, will expose the sides of second tungsten silicide layer 15, to the halogen etchants used. The sensitivity to halogen etchants, for dichlorosilane deposited metal silicide layers, is greater than the sensitivity of silane deposited metal silicide layers, and thus if the improved step coverage, obtained using dichlorosilane deposited metal silicide layers, is desired, an anneal cycle is needed prior to the polycide SAC patterning procedure. Therefore a first thermal anneal treatment is performed at a temperature between about 700 to 850° C., in a nitrogen ambient, using conventional furnace procedures, or using rapid thermal processing, (RTP). The first thermal anneal treatment reduces the sensitivity of exposed tungsten silicide to halogen reactants.

Figure 4:
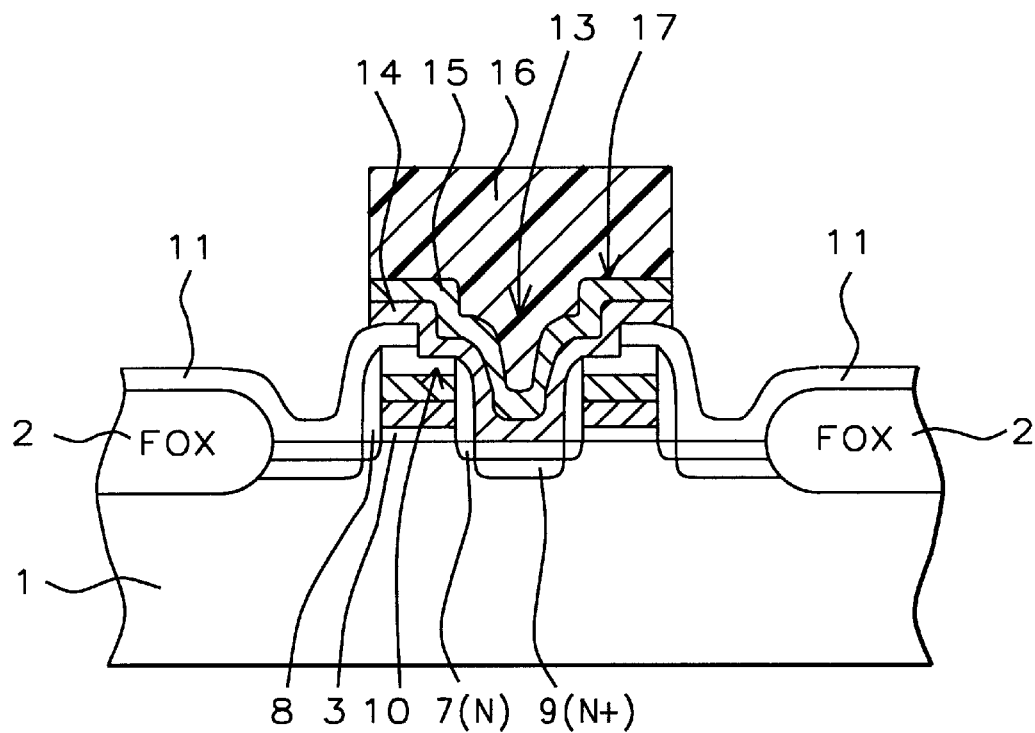
Figure 5:
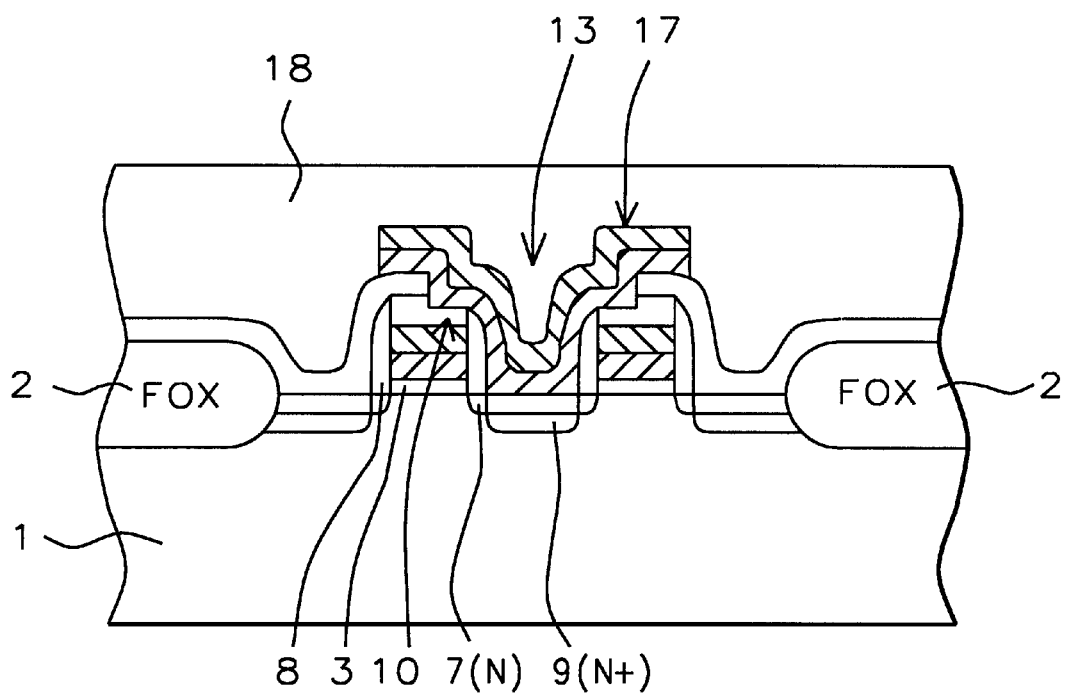

A second photoresist shape 16, is used as a mask, allowing an anisotropic RIE procedure, using $Cl_2$ as an etchant, to be performed to second tungsten silicide layer 15, and to second polysilicon layer 14, creating polycide SAC structure 17, schematically shown in FIG. 4. The exposed sides of second tungsten silicide layer 15, formed using dichlorosilane, were not degraded during the RIE procedure, as a result of the first thermal anneal treatment. After removal of photoresist shape 16, via plasma oxygen ashing and careful wet cleans, a second thermal anneal treatment is performed to densify second tungsten silicide layer 15, and to protect exposed surfaces of second tungsten silicide layer 15, from a subsequent silicon oxide deposition conditions. The second thermal anneal treatment is again performed using conventional furnace procedures, or rapid thermal processing, again at a temperature between about 700 to 850° C., in a nitrogen ambient. The second thermal anneal treatment protects exposed regions of second tungsten silicide layer 15, from the reactants used for deposition of IPO-2 layer 18, shown schematically in FIG. 5. IPO-2 layer 18, is deposited using LPCVD procedures, at a temperature between about 300 to 750° C., to a thickness between about 800 to 2000 Angstroms, using TEOS as a source. The integrity of second tungsten silicide layer 15, is not adversely influenced by the reactants used for IPO-2 layer 18. Planarization of IPO-2 layer 18, is accomplished via chemical mechanical polishing or reactive ion etching procedures, creating a smooth top surface topography.

Referring back to first tungsten silicide layer 5, anneal procedures, the identical anneal procedures, applied to, and described for, second tungsten silicide layer 15, can be applied to first tungsten silicide layer 5, after deposition, and after patterning to form gate structure 10.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a polycide, self-aligned contact, (SAC), structure, for a MOSFET device, on a semiconductor substrate, comprising the steps of:

providing a gate insulator layer on said semiconductor substrate;

providing insulator capped, polycide gate structures on said gate insulator layer;

providing insulator spacers on the sides of said polycide gate structures;

providing source/drain regions, in regions of said semiconductor substrate, not covered by said insulator capped, polycide gate structures;

depositing a first insulator layer;

forming a self aligned contact, (SAC), opening in said first insulator layer, exposing a source/drain region, between polycide gate structures;

depositing a polysilicon layer;

depositing a metal silicide layer;

performing a first thermal anneal treatment;

patterning of said metal silicide layer, and of said polysilicon layer, to create said polycide SAC structure;

performing a second thermal anneal treatment; and depositing a second insulator layer.

2. The method of claim 1, wherein said gate insulator layer is silicon dioxide, obtained via thermal oxidation, in an oxygen-steam ambient, at a temperature between about 850 to 1000° C., to a thickness between about 50 to 200 Angstroms.

3. The method of claim 1, wherein said polycide gate structures are comprised of an underlying in situ doped, polysilicon layer, deposited using LPCVD procedures, to a thickness between about 500 to 1500 Angstroms, and an overlying tungsten silicide layer, deposited using LPCVD procedures, to a thickness between about 800 to 1500 Angstroms, using tungsten hexafluoride and dichlorosilane, as reactants.

4. The method of claim 1, wherein said polycide gate structures are formed via an anisotropic RIE procedure, using $CHF_3$ as an etchant for the capping insulator layer, and using $Cl_2$ as an etchant for tungsten silicide and polysilicon layers.

5. The method of claim 1, wherein said first insulator layer is silicon oxide, deposited using LPCVD or PECVD procedures, to a thickness between about 800 to 2500 Angstroms.

6. The method of claim 1, wherein said SAC opening is formed in said first insulator layer, via an anisotropic RIE procedure, using $CHF_3$ as an etchant.

7. The method of claim 1, wherein said polysilicon layer is deposited using LPCVD procedures, to a thickness between about 200 to 1000 Angstroms, using dichlorosilane as a source, and doped in situ via the addition of arsine or phosphine.

8. The method of claim 1, wherein said metal silicide layer is tungsten silicide, deposited using LPCVD procedures, to a thickness between about 800 to 1500 Angstroms, using tungsten hexafluoride and dichlorosilane as reactants.

9. The method of claim 1, wherein said first thermal anneal treatment is performed using conventional furnace procedures, or using rapid thermal processing, at a temperature between about 700 to 850° C., in a nitrogen ambient.

10. The method of claim 1, wherein said polycide SAC structure is formed via an anisotropic RIE procedure, using $Cl_2$ as an etchant for said metal silicide layer, and for said polysilicon layer.

11. The method of claim 1, wherein said second thermal anneal treatment is performed using conventional furnace procedures, or using rapid thermal processing, at a temperature between about 700 to 850° C., in a nitrogen ambient.

12. The method of claim 1, wherein said second insulator layer is silicon oxide, deposited using LPCVD or PECVD procedures, at a temperature between about 300 to 750° C., using TEOS as a source.

13. A method for forming a polycide self-aligned contact, (SAC), structure, for MOSFET devices, on a semiconductor substrate, using thermal anneal procedures to protect a dichlorosilane grown, tungsten silicide layer, during a polycide patterning, and during an overlying insulator deposition, comprising the steps of:

providing a gate insulator layer on said semiconductor substrate;

providing silicon oxide capped, polycide gate structures, with silicon oxide spacers on the sides of said silicon oxide capped, polycide gate structures, on said gate insulator layer;

providing source/drain regions, in a region of said semiconductor substrate, not covered by said silicon oxide capped, polycide gate structures;

depositing a first inter-polysilicon oxide, (IPO-1), layer;

forming a self-aligned contact, (SAC), opening, in said IPO-1 layer, exposing a source/drain region, between silicon oxide capped, polycide gate structures;

depositing an in situ doped polysilicon layer;

depositing a tungsten silicide layer, on said in situ doped polysilicon layer, using dichlorosilane and tungsten hexafluoride as a source;

performing a first thermal anneal treatment;

patterning of said tungsten silicide layer, and of said in situ doped polysilicon layer, to form said polycide SAC structure, completely overlying said source/drain region, exposed in said SAC opening, and partially overlying a top portion of said silicon oxide capped, polycide gate structures, in areas where said polycide gate structures abut said SAC opening;

performing a second thermal anneal treatment; and depositing a second inter-polysilicon oxide, (IPO-2), layer.

14. The method of claim 13, wherein said IPO-1 layer, is a silicon oxide layer, deposited using LPCVD or PECVD procedures, to a thickness between about 800 to 2500 Angstroms, using TEOS as a source.

15. The method of claim 13, wherein said SAC opening is formed in said IPO-1 layer, via an anisotropic RIE procedure, using $CHF_3$ as an etchant.

16. The method of claim 13, wherein said in situ doped polysilicon layer is deposited using LPCVD procedures, to a thickness between about 200 to 1000 Angstroms, using dichlorosilane as a source, with the addition of either arsine or phosphine.

17. The method of claim 13, wherein said tungsten silicide layer is deposited using LPCVD procedures, to a thickness between about 800 to 1500 Angstroms, using tungsten hexafluoride and dichlorosilane as reactants.

18. The method of claim 13, wherein said first thermal anneal treatment is performed at a temperature between about 700 to 850° C., in a nitrogen ambient, using conventional furnace procedures, or using rapid thermal processing procedures.

19. The method of claim 13, wherein said polycide SAC structure is formed via an anisotropic RIE procedure, using $Cl_2$ as an etchant for said tungsten silicide layer, and for said in situ doped polysilicon layer.

20. The method of claim 13, wherein said second thermal anneal treatment is performed at a temperature between about 700 to 850° C., in a nitrogen ambient, using conventional furnace procedures, or using rapid thermal processing procedures.

21. The method of claim 13, wherein said IPO-2 layer, is a silicon oxide layer, deposited using LPCVD or PECVD procedures, at a temperature between about 300 to 750° C., to a thickness between about 800 to 2000 Angstroms, using TEOS as a source.

* * * * *